(12) United States Patent
Peijster

(10) Patent No.: US 9,030,649 B2
(45) Date of Patent: May 12, 2015

(54) TARGET POSITIONING DEVICE, METHOD FOR DRIVING A TARGET POSITIONING DEVICE, AND A LITHOGRAPHY SYSTEM COMPRISING SUCH A TARGET POSITIONING DEVICE

(75) Inventor: Jerry Johannes Martinus Peijster, Maartensdijk (NL)

(73) Assignee: Mapper Lithography IP B.V., Delft (NL)

( * ) Notice: Subject to any disclaimer, the term of this patent is extended or adjusted under 35 U.S.C. 154(b) by 309 days.

(21) Appl. No.: 13/612,496

(22) Filed: Sep. 12, 2012

(65) Prior Publication Data

US 2013/0094008 A1   Apr. 18, 2013

Related U.S. Application Data

(60) Provisional application No. 61/533,398, filed on Sep. 12, 2011, provisional application No. 61/533,404, filed on Sep. 12, 2011.

(30) Foreign Application Priority Data

Sep. 12, 2011 (NL) .................................... 2007403
Sep. 12, 2011 (NL) .................................... 2007404

(51) Int. Cl.
*G03B 27/58* (2006.01)
*H02K 41/02* (2006.01)
G03F 7/20 (2006.01)
*H01J 37/20* (2006.01)
(Continued)

(52) U.S. Cl.
CPC ................ *G03B 27/58* (2013.01); *H02K 41/02* (2013.01); *G03F 7/70716* (2013.01); *G03F 7/70725* (2013.01); *G03F 7/70758* (2013.01); *G03F 7/70841* (2013.01); *H01J 37/20* (2013.01); *H01J 37/3177* (2013.01); *H01J 2237/0266* (2013.01);
(Continued)

(58) Field of Classification Search
CPC ........ B82Y 10/00; B82Y 40/00; G03B 27/58; G03F 7/70716; G03F 7/70725; G03F 7/70758; G03F 7/70841
USPC ................ 310/12.05, 12.06; 355/72; 318/649
See application file for complete search history.

(56) References Cited

U.S. PATENT DOCUMENTS 6,279,490 B1 *   8/2001   Pastor .............................. 108/94
(Continued)

FOREIGN PATENT DOCUMENTS

EP           0366420 A    5/1990
WO     2010021543 A    2/2010

*Primary Examiner* — Colin Kreutzer
(74) *Attorney, Agent, or Firm* — Blakely Sokoloff Taylor & Zafmen

(57) ABSTRACT

A target positioning device, in particular for a lithography system, comprising a carrier for carrying a target, and a stage for carrying and moving the carrier along a first direction (X). The stage comprising two X-stage bases, both arranged on top of a common base plate, each X-stage base carries an X-stage carriage, and a Y-beam comprising a Y-stage for carrying said carrier and moving the carrier said carrier in a second direction (Y). The Y-beam bridges the space between the X-stage carriages and is connected to the X-stage carriages via a flexible coupling. The device further comprises two motors each for driving a corresponding X-stage carriage along its corresponding X-stage base. The two motors are arranged at least substantially below the stage. Each motor of said two motors is coupled to an eccentric cam or crank which is connected to the corresponding X-stage carriage via a crank shaft.

19 Claims, 6 Drawing Sheets

(51) Int. Cl.
*H01J 37/317* (2006.01)
*B82Y 10/00* (2011.01)
*B82Y 40/00* (2011.01)

(52) U.S. Cl.
CPC ...... *H01J 2237/16* (2013.01); *H01J 2237/2006* (2013.01); *H01J 2237/20221* (2013.01); *H01J 2237/20285* (2013.01); *B82Y 10/00* (2013.01); *B82Y 40/00* (2013.01)

(56) References Cited

U.S. PATENT DOCUMENTS

| 2005/0146169 A1* | 7/2005 | Thallner ............... 297/158.4 |
| 2005/0206865 A1* | 9/2005 | Kwan et al. ............... 355/53 |
| 2009/0231563 A1* | 9/2009 | Staals et al. ............... 355/53 |
| 2010/0155560 A1 | 6/2010 | Makino |

\* cited by examiner

TARGET POSITIONING DEVICE, METHOD FOR DRIVING A TARGET POSITIONING DEVICE, AND A LITHOGRAPHY SYSTEM COMPRISING SUCH A TARGET POSITIONING DEVICE

This is a non-provisional application claiming the benefit of U.S. Provisional Application No. 61/533,398, filed Sep. 12, 2011, and U.S. Provisional Application No. 61/533,404, filed Sep. 12, 2011.

BACKGROUND

The invention relates to a target positioning device, in particular for a lithography system, comprising a carrier for carrying a target, and a stage for carrying and moving the carrier along a first direction. The invention furthermore relates to a method for driving a target positioning device, in particular for a lithography system.

In particular for lithography systems which are designed for providing a sub-micron pattern on a wafer, any manipulation device for moving the wafer is designed to control the position of said wafer with high precision. Consequently the stages for use in lithography systems are designed to provide an extremely rigid and mechanically stiff construction. Usually highly accurate, rigid and robust stages are used, which take up a large amount of space.

Lithography systems are usually arranged in a clean room. Since floor space in a clean room is expensive it is disadvantageous when an apparatus has a large footprint. This drawback usually is accepted in order to obtain the required high precision.

In addition, electromagnetic dispersion fields as commonly present at the actuators of the stages, in particular from electro-magnetic actuators, are not desired a charged particle beam lithography system as for example disclosed in WO 2010/021543, because any variation in electric or magnetic fields may affect the position of the charged particle beam. In order to reduce the effect of the actuators of the stages, the actuators which are used to drive the target in a first direction during the projection of a charged particle beam onto the target is arranged remote from the stage. According to WO 2010/02153, the actuator is arranged in a direct line of the first direction and at a distance from the stage. The actuator comprises a push-pull rod which connects to the stage. Due to this set-up, the footprint of known target positioning device is large, in particular in the first direction.

It is an object of the present invention to provide an alternative target positioning device of high accuracy, which has a reduced footprint and thus requires less space in a clean room.

SUMMARY OF THE INVENTION

According to a first aspect, the invention provides a target positioning device, in particular for a lithography system, comprising
 a carrier for carrying a target,
 a stage for carrying and moving the carrier along a first direction (X), wherein said stage comprising two X-stage bases, both arranged on top of a common base plate, wherein each X-stage base carries an X-stage carriage, and a Y-beam comprising a Y stage for carrying said carrier and moving the carrier said carrier in a second direction (Y), wherein said Y-beam bridges the space between the X-stage carriages and is connected to the X-stage carriages via a flexible coupling,
 wherein the target positioning device further comprises two motors each for driving a corresponding X-stage carriage along its corresponding X-stage base, wherein the two motors are arranged at least substantially below the stage and each motor of said two motors is coupled to an eccentric cam or crank which is connected to the corresponding X-stage carriage via a crank shaft.

By arranging the motors at least substantially below the stage and using a crank shaft and an eccentric cam or crank, the required footprint of the target positioning device of the invention is reduced, which provides a more compact target positioning device, at least when compared with the x-actuators with a push-pull rod as disclosed in WO 2010/021543. In an embodiment the motors are arranged substantially below the common base plate of the stage.

The footprint of the target positioning device is even further reduced in an embodiment, wherein said at least one of said two motors is arranged in an area between the two X-stage bases.

In the target positioning device of the invention, the two motors each comprises a rotary actuator, the rotary drive thereof is converted in a linear drive of the corresponding X-stage carriage by using the crank shaft and the eccentric cam or crank. In an embodiment, each of said motors has a motor shaft which extends in a direction at least substantially transverse to the first direction. In an embodiment the first direction is substantially horizontal and the motor shaft is arranged substantially vertical.

It is observed that driving the X-stage carriage by using the crank shaft and the eccentric cam or crank requires a more complex regulation of the rotary actuators, at least when compared with linear actuators with a push-pull rod. In spite of this disadvantage, the inventor found that the use of rotary actuators can provide a reduction the footprint of the target positioning device of the invention. The use of rotary actuators can provide additional advantages as described in more detail below.

In an embodiment, said stage for carrying and moving the carrier is arranged on a wall part, which wall part, in use, is arranged as a wall of a vacuum chamber, and wherein the motor is arranged at least partially in or against the wall part. When the wall part is arranged as part of a vacuum chamber, said stage for carrying and moving the carrier is arranged inside a vacuum chamber, and said motor is at least partially arranged outside said vacuum chamber. Thus the part of the motor which is outside the vacuum chamber does not need to be vacuum compatible, and the target position device according to this embodiment does not require special vacuum compatible motors.

In an embodiment, the stage is arranged on a surface of the wall part which, in use, faces to the inside of the vacuum chamber. In an embodiment, motor is at least partially arranged on a side of the wall part which, in use, faces to the outside of the vacuum chamber.

In an embodiment, the wall part is arranged to form a bottom wall of the vacuum chamber, wherein the motor is arranged at least partially in or under the bottom wall. The bottom wall of the vacuum chamber is used for mounting the motor. In a further embodiment, the stage is arranged on this bottom wall, in particular on a surface of the bottom wall which faces to the inside of the vacuum chamber.

In an embodiment, the motor or the wall part is provided with a rotary feed through, at least at or near a position where the motor shaft traverses said wall part. In use, such a rotary feed through at least substantially maintains the pressure difference between the vacuum inside the vacuum chamber and the atmospheric pressure outside the vacuum chamber, and at the same time provides a passage for a rotatable member. Using this rotatable member a rotational movement of the motor is transferred to a rotational movement of the rotatable member inside the vacuum chamber for driving the stage.

In an embodiment, the rotary feed through comprises a ferro fluid rotary feed through. Such a ferro fluid rotary feed through provides a passage for the motor shaft. In use, the motor is arranged outside the vacuum chamber and only the motor shaft extends into the vacuum of the vacuum chamber and is connected to the eccentric cam or crank. Thus the motor is arranged outside the vacuum chamber and does not need to be vacuum compatible and also non-vacuum-compatible motors can be used in the target positioning device according to this embodiment of the invention.

In a further embodiment, said motor is provided with an encoder, wherein the encoder is arranged on a side of the wall part which, in use, faces to the outside of the vacuum chamber. In use, the encoder is arranged outside the vacuum chamber. Thus the encoder does not need to be vacuum compatible and also non-vacuum-compatible encoders can be used in the target positioning device according to this embodiment of the invention. In addition, when using rotary actuators, rotary encoders can be used.

In an embodiment, the motor shaft is provided with a shielding member which extends at least partially in a radial direction with respect to the motor shaft. When build-in in a charged particle lithography system which is provided with a shielding as described for example in WO 2010/021543, the shielding member is arranged to at least partially overlap with the shielding of the system. Using such a shielding member on the motor shaft which overlaps the shielding of the system, effectively shields the charged particle lithography system from fluctuation in electromagnetic fields of the motors. Special motors provided with a multiple shield in the electromagnetic actuator are not necessary in the target positioning device according to this embodiment of the invention.

In order increase the shielding effect one or more of the following measures may be used: Preferably at the overlapping region, the shield member is arranged at a distance from the shielding of the system. Preferably at the overlapping region, a surface of the shielding member which faces the shielding of the system is arranged substantially parallel to shielding of the system.

In an embodiment, the shielding member is rigidly attached to the motor shaft, preferably at substantially the complete circumference of the motor shaft. Thus the shielding member rotates together with the motor shaft, and the shielding member is preferably circle symmetric with respect to a centre line of the motor shaft. But more important no stray electromagnetic field can pass between the shielding member and the motor shaft.

In particular for lithography systems the target must be driven with a high accuracy, preferably any deviation from the desired path must be smaller than the resolution of the lithography system. Usually highly accurate, rigid and robust stages are used, in which any play is mechanically minimized. As described above, the stages for use in lithography systems are designed to provide an extremely rigid and mechanically stiff construction, which makes such stages heavy and very expensive.

In an embodiment, the Y-beam is connected to the X-stage carriage via the flexible coupling which comprises one or more flexible struts, which flexible struts are at least substantially rigid in an axial direction of said struts and are flexible in a direction substantially transverse to the axial direction of said struts. It is counter intuitive to connect the Y-beam to the X-stage carriage via flexible struts, because such connection is not in itself accurate, is not rigid or robust. However, due to the flexible struts, the Y-beam is not only movable in the X-direction, but also movable with respect to the X-stage carriages in a direction at least transverse to the axial direction of the struts. Thus this embodiment of the invention provides an additional freedom of movement which can be used to correct a deviation from the desired path by accurately and properly driving the X-stage carriages, as described in more detail below. Due to the flexible coupling a deviation from the desired path can actively be compensated which results in a controlled accuracy, rigidity and robustness of the target positioning device.

In an embodiment, each X-stage carriages is connected to the Y-beam via a first and a second flexible strut which extend at least substantially parallel to each other in a direction which is at least substantially transverse to the first direction, and wherein the first and second flexible strut are spaced apart in said first direction. In an embodiment, the first direction extends in an at least substantially horizontal direction, and wherein the first and second flexible strut extends in an at least substantially vertical direction. With this setup a rotational deviation of the Y-beam, at least substantially around the vertical direction Rz, for example due to a small deviation in the straightness of the X stages, can be compensated.

Due to the flexible coupling and the controlled accuracy, rigidity and robustness, the actual stages themselves do not need to be as highly accurate, rigid and robust as the stages usually applied in lithography systems. The target positioning device of the present invention provides more functionality in driving and controlling the movement of the target, allows the use of less accurate, rigid and robust stages yielding less a expensive target positioning device, and provides more freedom in the design and construction of target positioning devices.

In an embodiment, said motors are torque motors. Thus the force exerted by the motors to drive the X-stage carriages can be controlled.

In an embodiment, said target positioning device further comprises a controller for controlling the motors, wherein the controller is arranged for controlling each of the motors individually.

In an embodiment, the controller is arranged for controlling each of said motors in dependence of a position of the carrier on the Y-beam. The position of the carrier on the Y-beam affects the centre of mass of the target position device. Preferably the controller is arranged for controlling each of said motors in dependence of the position of the centre of mass along the Y-beam. This position of the centre of mass is calculated from the position of the carrier on the Y-beam.

In an embodiment, the controller is arranged for controlling the force which each of said motors exerts on its corresponding X-stage carrier in dependence of the position of the centre of mass along the Y-beam. Preferably the force which a motor exerts on its corresponding X-stage carrier in inversely dependent on the distance between the x-stage carrier and the centre of mass along the Y-beam, in particular on the distance between the flexible coupling of the corresponding X-stage carrier and the centre of mass along the Y-beam.

According to a second aspect, the invention provides a lithography system comprising a target positioning device as described above.

According to a third aspect, the invention provides a method for driving a target positioning device within a system, in particular within a lithography system, said target positioning device comprising a carrier for carrying a target,
a stage for carrying and moving the carrier within said system, wherein said stage comprises a first X-stage base and a second X-stage base, both arranged on top of a common base plate, wherein said first X-stage base carries a first X-stage carriage, and wherein said second X-stage base carries a second X-stage carriage, a Y-beam comprising a Y-stage for carrying said carrier and moving said carrier in a second direction (Y), wherein said Y-beam bridges the space between the X-stage carriages and is connected to the first X-stage carriage via a first flexible coupling and to the second X-stage carriage via a second flexible coupling, two motors, each for driving a corresponding X-stage carriage along its corresponding X-stage base along a first direction (X), and a controller for controlling the motors, wherein the controller is arranged for controlling each of the motors individually, wherein said method comprises a step of individually controlling the motors for at least substantially preventing a deviation in orientation of the Y-beam relative to said x-stage bases due to the flexible coupling. The flexible mount is adapted for compensating for some misalignment of the first x-stage carriage relative to the second x-stage carriage, for instance due to thermal expansion of the y-beam and/or of the x-stage bases. The flexibility of the mount however also allows for some deviation in orientation of the y-beam due to displacement of center of mass of the carrier, in particular due to displacement of the y-stage along the y-beam. By preventing such a deviation in orientation, an improved positioning accuracy is achieved, in which considerably less correction of a position of a target is required.

The first and second directions are preferably orthogonal to each other.

In an embodiment said motors are torque motors, and wherein said method comprises a step of individually controlling the torque of the motors. Torque motors can be precisely controlled.

In an embodiment the controller is arranged for controlling the motors such that a resulting torque on the carriage is substantially equal to zero. Driving of the motors may thus translate the carrier and target thereon along the first direction X, without substantially rotating the target, in particular without substantially rotating the target around an axis substantially perpendicular to the first direction.

In an embodiment said motors are controlled in dependence on the positions of the carrier on the Y-beam relative to the first X-stage base and relative to said second X-stage base. The present invention thus takes into account the fact the either the first or the second motor has to perform more work than the other motor for displacing the y-beam along the first direction X when the position of the carrier on the Y-beam is changed.

In an embodiment the method further comprises a step of determining the relative position of a centre of mass of said Y-beam, said Y-stage, said carrier and/or said target, with respect to said first x-stage base and said second x-stage base, wherein said motors are further controlled in dependence on said determined relative position of said center of mass. The relative position is preferably a relative position projected on a plane spanned by said first and second directions. The amount of work each motor has to perform can be estimated based on said relative position of the center of mass.

In an embodiment said method further comprises a step of determining the relative position of a center of mass of said Y-beam, said Y-stage, said carrier and target, with respect to said first flexible coupling and said second flexible coupling, wherein said motors are controlled in dependence on said relative position of the said center of mass. By measuring the relative position of the center of mass with respect to the flexible couplings, a more accurate estimate can be determined for the amount of work each motor has to do to drive movement of the y-beam along the first direction X.

In an embodiment said method further comprises the step of determining a mass of said Y-beam, said Y-stage, said carrier and/or said target, wherein said motors are further controlled in dependence on said mass. The mass is of the y-beam, y-stage and carrier is typically predetermined.

In an embodiment the method further comprises the step of determining a momentum of said Y-beam, said Y-stage, said carrier and/or said target, wherein the motors are further controlled in dependence on said momentum.

In an embodiment said motors are controlled for substantially preventing a rotation of the Y-beam around an axis normal to said first and second directions. Rotation around said axis, typically the z-axis in a system, is thus prevented, providing higher positioning accuracy which is in particular of importance for lithographic processes such as stitching and overlay.

In an embodiment said first and said second flexible coupling substantially support said Y-beam.

In an embodiment the first and second motors are controlled to provide an angular momentum of the y-beam in a plane parallel to said first and second direction, substantially equal to zero during movement of the x-stage carriages over the respective x-stage bases.

In an embodiment said system is a lithography system comprising an optical column, wherein said motors are controlled for substantially preventing a rotation of said target around an axis normal to said first and second directions, improving among others stitching and overlay in such a lithography system.

In an embodiment said system further comprises two sensors for respectively measuring the power used by said first motor and by said second motor, wherein said motors are controlled based on said measured powers.

In an embodiment the flexible coupling of each x-stage with the y-beam comprises two flexible struts which are spaced apart and arranged in parallel and normal to said first and second direction. The struts thus substantially limit translational movement of the y-beam relative to the x-stage carriers in a direction perpendicular to the first and second directions, while allowing at least some translational movement of the y-beam relative to the x-stage carriers along the second direction Y.

According to a fourth aspect, the invention provides a method for driving a target positioning device within a system, in particular within a lithography system, said target positioning device comprising a carrier for carrying a target, a stage for carrying and moving the carrier within said system, wherein said stage comprises a first X-stage base and a second X-stage base, both arranged on top of a common base plate, wherein said first X-stage base carries a first X-stage carriage, and wherein said second X-stage base carries a second X-stage carriage, a Y-beam comprising a Y-stage for carrying said carrier and moving said carrier in a second direction (Y), wherein said Y-beam bridges the space between the X-stage carriages and is connected to the first X-stage carriage via a first flexible coupling and to the second X-stage carriage via a second flexible coupling, two motors, each for driving a corresponding X-stage carriage along its corresponding X-stage base along a first direction (X), and a controller for controlling the motors, wherein the controller is arranged for controlling a force which each of said motors applies to its corresponding x-stage carriage individually. By controlling the force applied by each of said motors in this manner, rotation of the y-beam can be substantially prevented.

In an embodiment the method comprises any one of the features of the method according to the third aspect as described herein.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
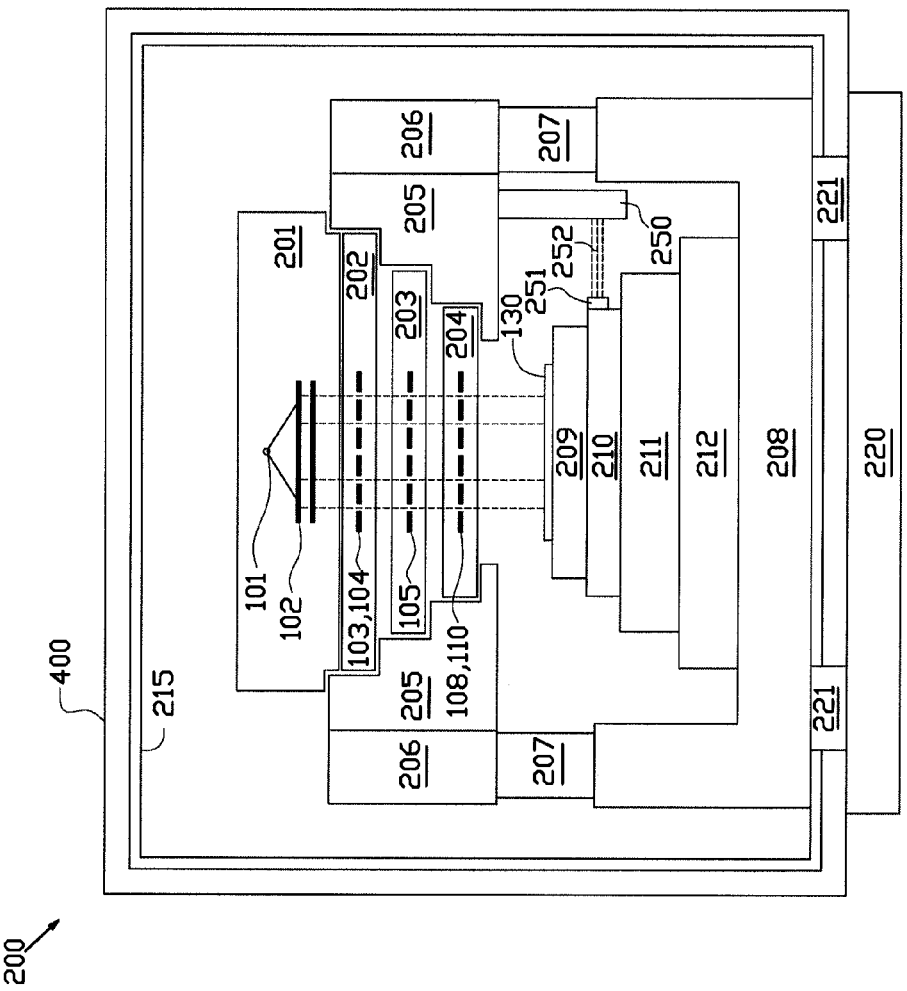
FIG. 1 shows a simplified block diagram illustrating the principal elements of a modular lithography system.

FIG. 1 shows a simplified block diagram illustrating the principal elements of a modular lithography system. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems. In the embodiment shown in FIG. 1, these modular subsystems include:

an illumination optics module 201 including the charged particle beam source 101 and beam collimating system 102,
an aperture array and condenser lens module 202 including aperture array 103 and condenser lens array 104,
a beam switching module 203 including beamlet blanker array 105, and
projection optics module 204 including beam stop array 108, beam deflector array 109, and projection lens arrays 110.

In the embodiment shown in FIG. 1, the alignment frame comprises an alignment inner sub-frame 205 and an alignment outer sub frame 206. A frame 208 supports the alignment sub-frames 205 and 206 via vibration damping mounts 207. The wafer 130 rests on wafer table 209, which is in turn mounted on chuck 210. Chuck 210 sits on the short stroke stage 211 which is arranged for driving said chuck 210 over a small distance along all six degrees freedom. The short stroke stage 211 is mounted on top of a long stroke stage 212 which is arranged for driving said short stroke stage 211 and the chuck 210 along two orthogonal directions (X and Y) in an at least substantially horizontal plane. The lithography machine 200 is enclosed in vacuum chamber 400, which includes a mu metal (μmetal) shielding layer or layers 215. The machine rests on base plate 220 supported by frame members 221.

In an embodiment the frame 208 and the frame member 211 are formed as one unit. For example the frame 208 and the frame member 211 are machined from a single monolithic block of material.

Figure 2:
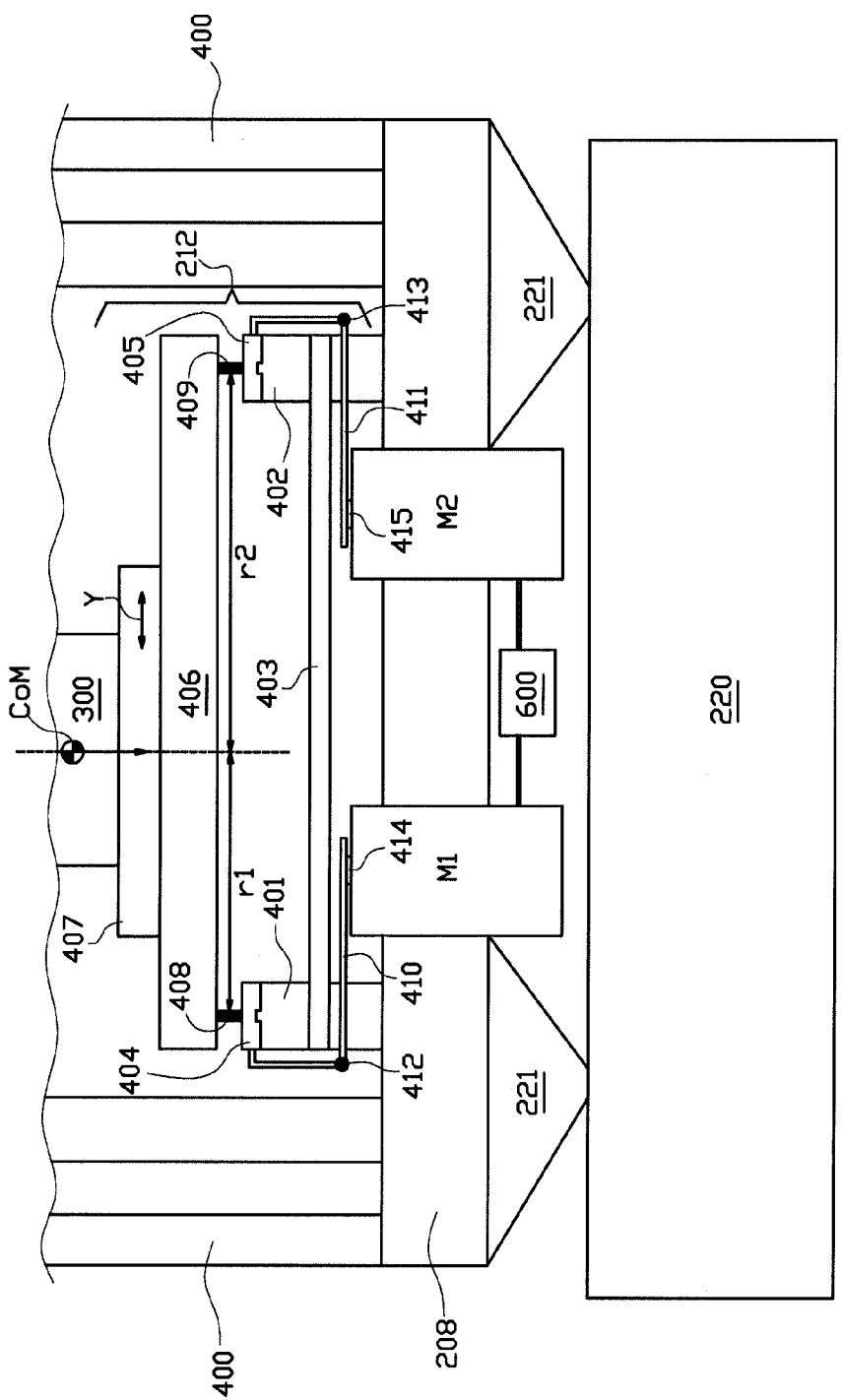
FIG. 2 shows a schematic cross section of the lower part of the lithography system.

The frame 208 can also be a separate wall part, which in use forms the bottom wall of the vacuum chamber as shown in FIG. 2. The target positioning device of the invention can be mounted on or in the frame (or wall part) 208 before the frame 208 is arranged on the base plate 220 and/or before the other part of the vacuum chamber 400 is arranged onto the frame 208.

The position of the wafer and wafer table with respect to the optical column 201, 202, 203, 204 is measured with a measuring device 250 which is attached to the alignment sub-frame 205 which monitors the position of the chuck 210 with respect to the measuring device 250. The measuring device 250 comprises, for example, an interferometer system and the chuck 210 is then provided with a mirror 251 for reflecting the light beams 252 from the interferometer system. A measuring signal from the measuring device 250 is provided to a control unit 600 (see for example FIGS. 2 and 3) which control unit is arranged for driving the short stroke stage 211 and/or the long stroke stage 212.

FIG. 2 shows the long stroke stage 212 for carrying and moving the carrier 300 along a first direction (X) and a second direction (Y). The carrier 300 may comprise the wafer table 209, the chuck 2010 and the short stroke stage 211.

The long stroke stage 212 comprises two X-stage bases 401, 402, both arranged on top of a common base plate 403, wherein each X-stage base carries an X-stage carriage. Underneath said base plate 403, two motors M1, M2 are arranged, each for driving a corresponding X-stage carriage 404, 405 along its corresponding X-stage base 401, 402. The Y-beam 406 comprising a Y stage 407 for carrying said carrier 300 and moving said carrier 300 in a second direction (Y), wherein said Y-beam bridges the space between the X-stage carriages 404, 405 and is connected to the X-stage carriages via a flexible coupling 408, 409. Each motor M1, M2 is coupled to an eccentric cam or crank 410, 411 which is connected to the corresponding X-stage carriage 404, 405 via a crank shaft 412, 413.

As shown in FIG. 2, each of said motors M1, M2 has a motor shaft 414, 415 which extends in a direction at least substantially transverse to the first (X) direction and the second (Y) direction. In addition, said two motors M1, M2 are arranged in an area between the two X-stage bases 401, 402.

As also shown in FIG. 2, said stage 212 for carrying and moving the carrier 300 is arranged inside a vacuum chamber 400, and wherein said motors M1, M2 is at least partially arranged outside said vacuum chamber 400.

Figure 4:
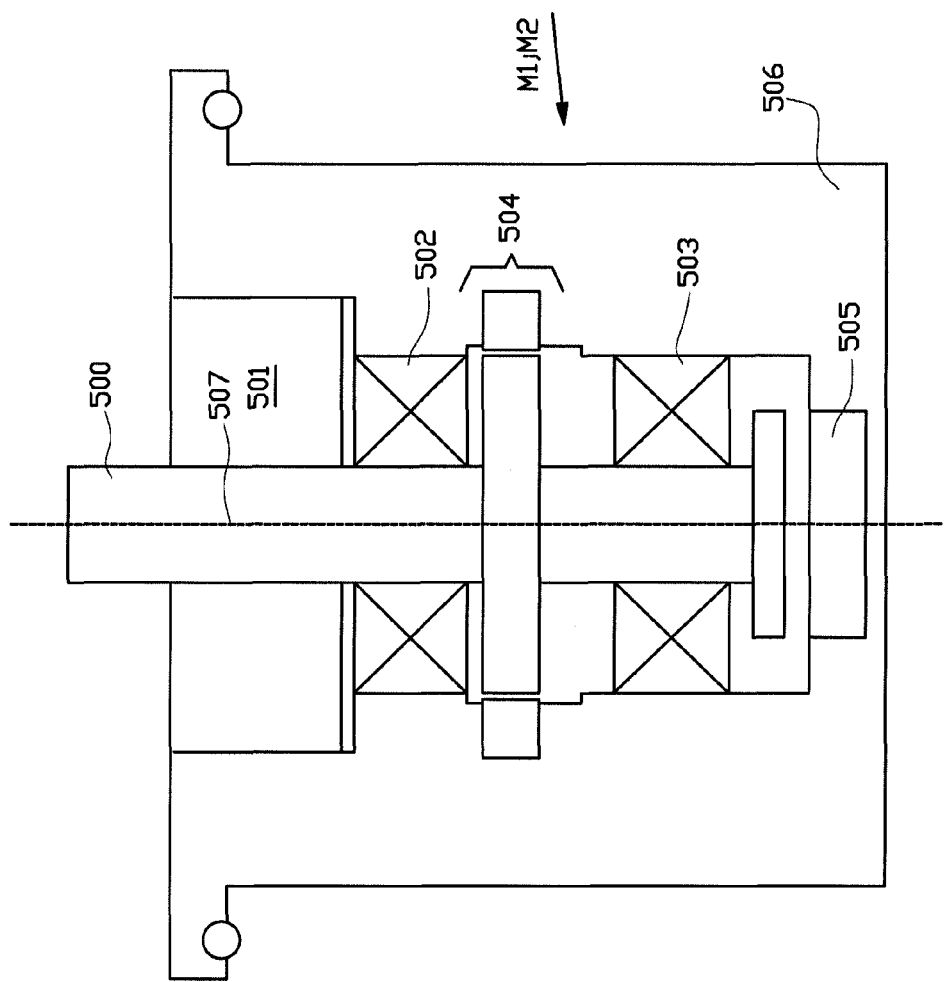
FIG. 4 shows a detailed view of a motor with a vacuum feed through for use in the lithography system of the invention.

The motor, at least at or near a position wherein the motor shaft traverses a wall of said vacuum chamber 400, is provided with a rotary feed through. As shown in FIG. 4, motor M1, M2 comprises a housing 506, which can be mounted in an opening in the wall of the vacuum chamber 400. The motor comprises a rotating shaft 500 which is mounted in the housing via two bearings 502, 503. Between these bearings 502, 503, the torque motor 504 for driving the rotating shaft, is arranged.

The motor is provided with a ferro fluid rotary feed through 501 which enable the rotating shaft 500 of the motor to get into the vacuum chamber 400. Due to the ferro fluid rotary feed through, every part of the motor below this feed through 501 can be at substantially atmospheric pressure.

Furthermore said motor M1, M2 is provided with an encoder 505, wherein the encoder is arranged outside the vacuum chamber at the lower end of the rotating shaft 500.

Figure 3:
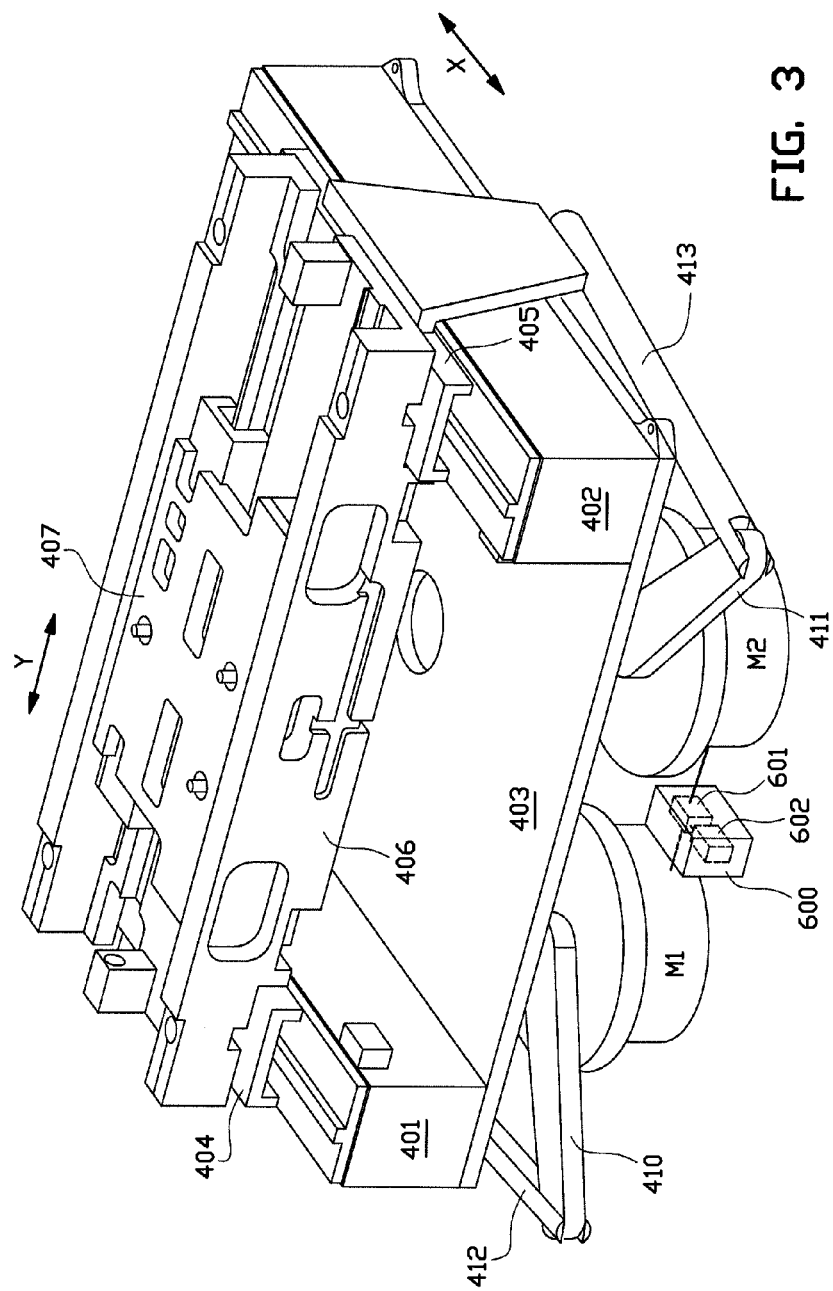
FIG. 3 shows a schematic view of a long stroke stage according to the invention.
Figure 5A:
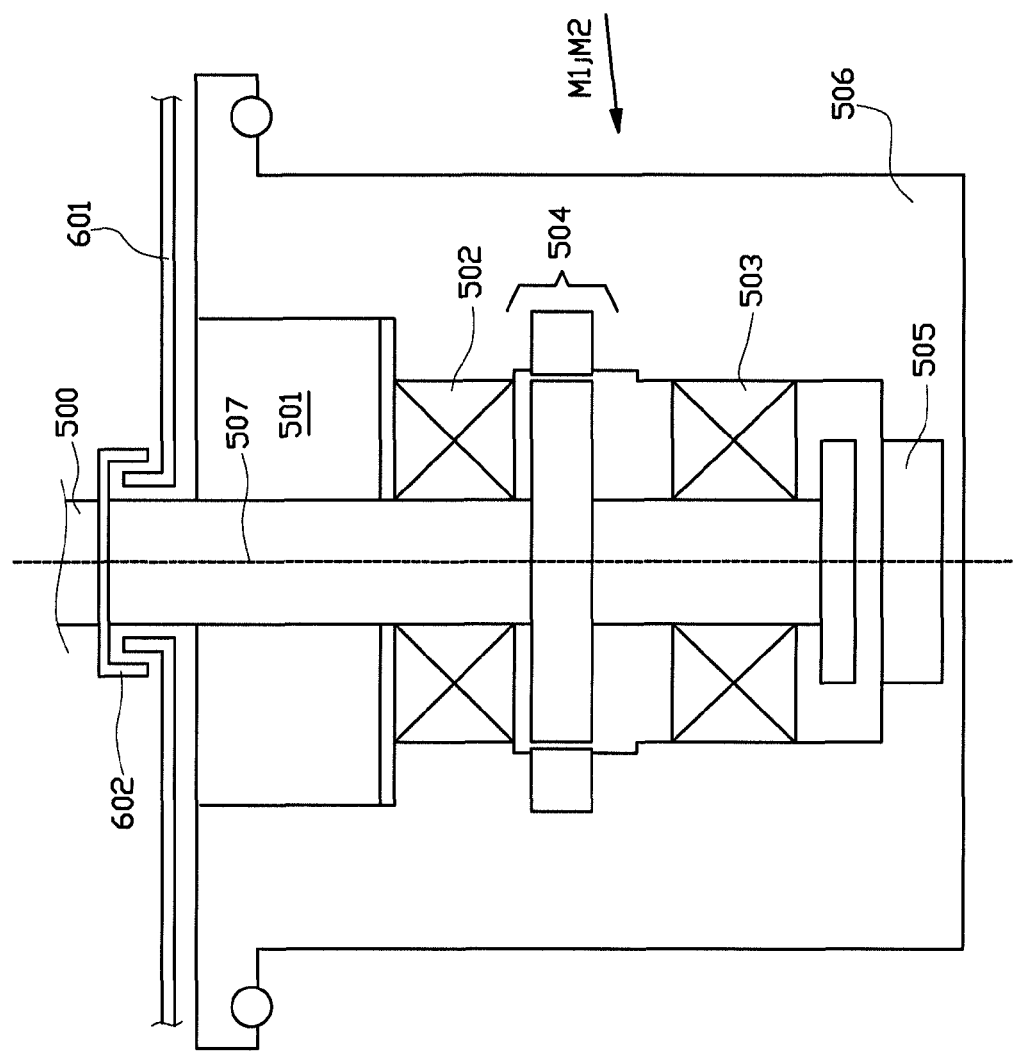
FIGS. 5A and 5B show a detailed view of the motor of FIG. 4 which is additionally provided with a shielding arrangement.
Figure 5B:
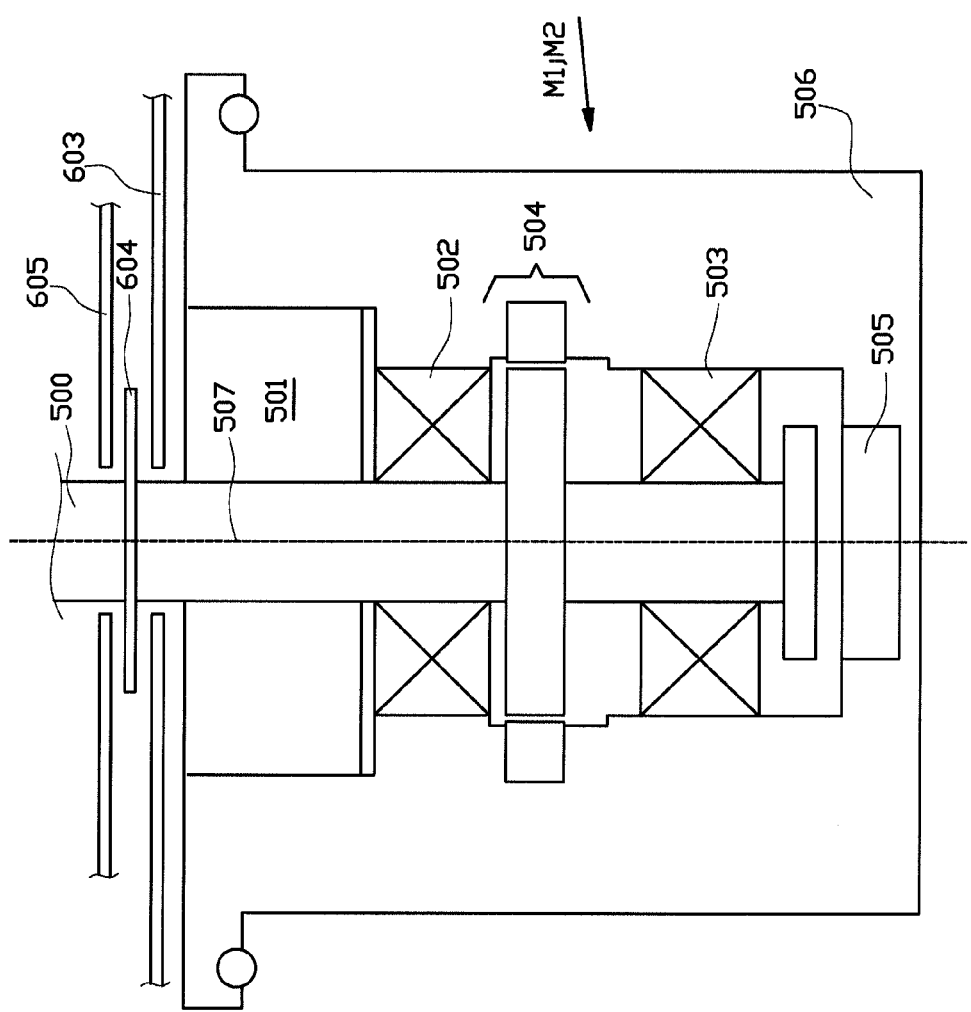

As clearly shown in FIGS. 2 and 3, the motors M1, M2 are arranged substantially below the stage 212 and between the X-stage bases 401, 402. In order to shield the optical charged particle column 201, 202, 203, 204 and the target 130, shielding layer or layers 215 are provided. In order to provide a proper shielding at the rotary feed through 501, the motor shaft 500 is provided with a shielding member 602, 604 which extends at least partially in a radial direction with respect to the motor shaft 500, as shown in the examples of FIGS. 5A and 5B. When build-in in a charged particle lithography system which is provided with a shielding layer 601 or layers 603, 605, the shielding member 602, 604 is arranged to at least partially overlap with the shielding layer 601 or layers 603, 605 of the system. Using a shielding member 602 or 604 on the motor shaft which overlaps the shielding layer 601 or layers 603, 605 of the system, effectively shields the charged particle lithography system from fluctuation in electromagnetic fields of the motors M1, M2.

The shielding member 602, 604 is rigidly attached to the motor shaft 500 at substantially the complete circumference of the motor shaft 500. Thus the shielding member 602, 604 rotates together with the motor shaft 500, and the shielding member 602, 604 is preferably circle symmetric with respect to a centre line 507 of the motor shaft 500. At the overlapping region, the shield member 602, 604 is arranged at a short distance from the shielding layer 601 or layers 603, 605 of the system. In addition, at the overlapping region, a surface of the shielding member 602, 604 which faces the shielding layer 601 or layers 603, 605 of the system is arranged substantially parallel to a surface of the shielding layer 601 or layers 603, 605 of the system which faced the shielding member 602, 604.

In the example as shown in FIG. 5A, the overlapping region between the shielding member 602 and the shielding layer 601 of the system extends substantially parallel to the motor shaft 500.

In the example as shown in FIG. 5B, the shielding member 604 extends perpendicular to the motor shaft 500 and is arranged to extend in between the shielding layers 603, 605 of the system.

As shown in FIG. 2 the Y-beam 406 is connected to the X-stage carriages 404, 405 via one or more flexible struts 408, 409, which flexible struts are at least substantially rigid in an axial direction of said struts 408, 409 and are flexible in a direction substantially transverse to the axial direction of said struts 408, 409. In particular, each X-stage carriages 408, 409 is connected to the Y-beam via a first and a second flexible strut which extend at least substantially parallel to each other in a direction which is at least substantially transverse to the first (X) direction, and wherein the first and second flexible strut are spaced apart in said first (x) direction.

The lithography system 200 is usually arranged such that the first (X) direction extends in an at least substantially horizontal direction, and the first and second flexible strut extends in an at least substantially vertical direction.

The lithography system 200 may further comprise a controller 600 for controlling the motors M1, M2, wherein the controller 600 is arranged for controlling each of the motors individually. The controller 600 comprises a processor 601 which drives the motors M1, M2 in accordance to a computer program which is stored in a memory 602, which computer program comprises instructions for carrying out one or more of the method steps described above or as described in the method claims as attached. Although the controller 600 in FIGS. 2 and 3 is schematically arranged close to the motors M1, M2, in particular in between the motors M1, M2, said controller 600 may also be arranged at a position remote from the motors or even remote from the lithography system.

The controller is arranged for controlling each of said motors in dependence of a position of said carrier on the Y-beam. In particular in dependence of the position of the centre of mass CoM with respect to the flexible struts 408, 409, which position is defined by the distances r1, r2 as shown in FIG. 2. Essentially the torque of the motors M1, M2 is controlled such that the force of motor M1 on the first carriage 404 multiplied with the distance r1 is at least substantially equal to the force of motor M2 on the second carriage 405 multiplied with the distance r2.

In summary, the invention provides a target positioning device, in particular for a lithography system, comprising a carrier for carrying a target, and a stage for carrying and moving the carrier along a first direction (X). The stage comprising two X-stage bases, both arranged on top of a common base plate, each X-stage base carries an X-stage carriage, and a Y-beam comprising a Y-stage for carrying said carrier and moving the carrier said carrier in a second direction (Y). The Y-beam bridges the space between the X-stage carriages and is connected to the X-stage carriages via a flexible coupling. The device further comprises two motors each for driving a corresponding X-stage carriage along its corresponding X-stage base. The two motors are arranged at least substantially below the stage. Each motor of said two motors is coupled to an eccentric cam or crank which is connected to the corresponding X-stage carriage via a crank shaft.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Target positioning device, in particular for a lithography system, comprising
    a carrier for carrying a target,
    a stage for carrying and moving the carrier along a first direction (X), wherein said stage comprising two X-stage bases, both arranged on top of a common base plate, wherein each X-stage base carries an X-stage carriage, and a Y-beam comprising a Y stage for carrying said carrier and moving said carrier in a second direction (Y), wherein said Y-beam bridges the space between the X-stage carriages and is connected to the X-stage carriages via a flexible coupling, and
    two motors each for driving a corresponding X-stage carriage along its corresponding X-stage base, wherein the two motors are arranged at least substantially below the stage and each motor of said two motors is coupled to an eccentric cam or crank which is connected to the corresponding X-stage carriage via a crank shaft.

2. Target positioning device according to claim 1, wherein at least one of said two motors is arranged in an area between the two X-stage bases.

3. Target positioning device according to claim 1, wherein each of said motors has a motor shaft which extends in a direction at least substantially transverse to the first direction.

4. Target positioning device according to claim 3, wherein the first direction is substantially horizontal and the motor shaft is arranged substantially vertical.

5. Target positioning device according to claim 1, wherein said stage for carrying and moving the carrier is arranged on a wall part, which wall part in use is arranged as a wall of a vacuum chamber, and wherein the motor is arranged at least partially in or against the wall part.

6. Target positioning device according to claim 5, wherein the stage is arranged on a surface of the wall part which, in use, faces to the inside of the vacuum chamber.

7. Target positioning device according to claim 6, wherein motor is at least partially arranged on a side of the wall part which, in use, faces to the outside of the vacuum chamber.

8. Target positioning device according to claim 7, wherein the motor or the wall part is provided with a rotary feed through, at least at or near a position where the motor shaft traverses said wall part.

9. Target positioning device according to claim 8, wherein the rotary feed through comprises a ferro fluid rotary feed through.

10. Target positioning device according to claim 7, wherein said motor is provided with an encoder, wherein the encoder is arranged on a side of the wall part which, in use, faces to the outside of the vacuum chamber.

11. Target positioning device according to claim 1, wherein the motor shaft is provided with a shielding member which extends at least partially in a radial direction with respect to the motor shaft.

12. Target positioning device according to claim 11, wherein the shielding member is rigidly attached to the motor shaft, preferably at substantially the complete circumference of the motor shaft.

13. Target positioning device according to claim 1, wherein the Y-beam is connected to the X-stage carriages via one or more flexible struts, which flexible struts are at least substantially rigid in an axial direction of said struts and are flexible in a direction substantially transverse to the axial direction of said struts.

14. Target positioning device according to claim 13, wherein each X-stage carriages is connected to the Y-beam via a first and a second flexible strut which extend at least substantially parallel to each other in a direction which is at least substantially transverse to the first direction, and wherein the first and second flexible strut are spaced apart in said first direction.

15. Target positioning device according to claim 14, wherein the first direction extends in an at least substantially horizontal direction, and wherein the first and second flexible strut extends in an at least substantially vertical direction.

16. Target positioning device according to claim 1, wherein said motors are torque motors.

17. Target positioning device according to claim 1, further comprising a controller for controlling the motors, wherein the controller is arranged for controlling each of the motors individually.

18. Target positioning device according to claim 17, wherein the controller is arranged for controlling each of said motors in dependence of a position of said carrier on the Y-beam.

19. Lithography system comprising a target positioning device according to any one of the previous claims.

* * * * *